United States Patent
Li et al.

(10) Patent No.: US 11,605,738 B2
(45) Date of Patent: Mar. 14, 2023

(54) THIN FILM TRANSISTOR, METHOD FOR FABRICATING THE SAME, METHOD FOR CONTROLLING THE SAME, DISPLAY PANEL AND DISPLAY DEVICE

(71) Applicant: BOE Technology Group Co., Ltd., Beijing (CN)

(72) Inventors: Junjie Li, Beijing (CN); Yuanyuan Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 705 days.

(21) Appl. No.: 16/472,417

(22) PCT Filed: Dec. 4, 2018

(86) PCT No.: PCT/CN2018/119152
§ 371 (c)(1),
(2) Date: Jun. 21, 2019

(87) PCT Pub. No.: WO2019/184428
PCT Pub. Date: Oct. 3, 2019

(65) Prior Publication Data
US 2021/0336066 A1 Oct. 28, 2021

(30) Foreign Application Priority Data

Mar. 29, 2018 (CN) .......................... 201810270332.X

(51) Int. Cl.
*H01L 29/786* (2006.01)
*G02F 1/1368* (2006.01)
(Continued)

(52) U.S. Cl.
CPC .... *H01L 29/78645* (2013.01); *G02F 1/13685* (2021.01); *H01L 27/3244* (2013.01);
(Continued)

(58) Field of Classification Search
CPC ............. H01L 27/3244; H01L 29/6675; H01L 29/66969; H01L 29/7869;
(Continued)

(56) References Cited

U.S. PATENT DOCUMENTS

| 2011/0227851 A1* | 9/2011 | Oh ......................... G06F 3/047 345/173 |
| 2015/0243849 A1* | 8/2015 | Stroetmann ......... H01L 29/1606 257/13 |

(Continued)

FOREIGN PATENT DOCUMENTS

| CN | 105161496 A | 12/2015 |
| CN | 107819038 A | 3/2018 |
| CN | 108461538 A | 8/2018 |

OTHER PUBLICATIONS

International Search Report dated Mar. 8, 2019 for related International Application No. PCT/CN2018/119152.
(Continued)

*Primary Examiner* — Wasiul Haider
(74) *Attorney, Agent, or Firm* — ArentFox Schiff LLP; Michael Fainberg

(57) ABSTRACT

This disclosure relates to the field of display technologies, and discloses a thin film transistor, a method for fabricating the same, a method for controlling the same, a display panel, and a display device. The thin film transistor includes: a base substrate, a semiconductor active layer on one side of the base substrate, a source electrically connected with one end of the semiconductor active layer, a drain electrically connected with the other end of the semiconductor active layer, a gate insulated from the semiconductor active layer, the (Continued)

source, and the drain, and a modulation electrode insulated from the semiconductor active layer, the gate, the source, and the drain. The modulation electrode is proximate to the drain, and an orthographic projection of the modulation electrode on the base substrate overlaps with an orthographic projection of the semiconductor active layer on the base substrate

12 Claims, 4 Drawing Sheets

(51) Int. Cl.
    *H01L 27/32*     (2006.01)
    *H01L 29/66*     (2006.01)
    *H01L 29/40*     (2006.01)

(52) U.S. Cl.
    CPC .... *H01L 29/6675* (2013.01); *H01L 29/66969* (2013.01); *H01L 29/402* (2013.01); *H01L 29/7869* (2013.01)

(58) Field of Classification Search
    CPC ..... H01L 29/402–407; H01L 29/78609; H01L 29/78645–78678; G02F 1/13685
    See application file for complete search history.

(56) References Cited

U.S. PATENT DOCUMENTS

| 2016/0005880 A1* | 1/2016 | Tada ..................... H01L 27/124 257/72 |
| 2017/0148817 A1* | 5/2017 | Shi ........................ H01L 27/124 |
| 2017/0207345 A1 | 7/2017 | Shi |
| 2018/0076238 A1 | 3/2018 | Lim et al. |
| 2019/0393340 A1* | 12/2019 | Liang .................. H01L 29/0865 |

OTHER PUBLICATIONS

Chinese Office Action dated Jun. 3, 2019 for related Chinese Application No. 201810270332.X.
Chinese Office Action dated Oct. 12, 2019 for related Chinese Application No. 201810270332.X.

* cited by examiner

THIN FILM TRANSISTOR, METHOD FOR FABRICATING THE SAME, METHOD FOR CONTROLLING THE SAME, DISPLAY PANEL AND DISPLAY DEVICE

This application is a US National Stage of International Application No. PCT/CN2018/119152, filed Dec. 4, 2018, which claims priority to Chinese Patent Application No. 201810270332.X, filed with the Chinese Patent Office on Mar. 29, 2018, and entitled "Thin film transistor, method for fabricating the same, method for controlling the same, display panel and display device", which is hereby incorporated by reference in its entirety.

FIELD

This disclosure relates to the field of display technologies, and particularly to a thin film transistor, a method for fabricating the same, a method for controlling the same, a display panel and a display device.

BACKGROUND

A Low Temperature Poly Silicon-Thin Film Transistor (LTPS-TFT) has been widely applied to various display devices due to its high electron mobility. However the problem of leakage current is an important factor affecting the quality of the LTPS-TFT. Accordingly it is highly desirable at present to address leakage current in the TFT.

SUMMARY

An embodiment of this disclosure provides a thin film transistor. The thin film transistor includes: a base substrate; a semiconductor active layer on one side of the base substrate; a source electrically connected with one end of the semiconductor active layer; a drain electrically connected with the other end of the semiconductor active layer; a gate insulated from the semiconductor active layer, the source, and the drain; and a modulation electrode insulated from the semiconductor active layer, the gate, the source, and the drain, wherein the modulation electrode is proximate to the drain, and an orthographic projection of the modulation electrode on the base substrate has an overlap area with an orthographic projection of the semiconductor active layer on the base substrate.

Optionally in some embodiments of this disclosure, the gate is on a side of the semiconductor active layer away from the base substrate, and the modulation electrode is located on a side of the gate away from the base substrate.

Optionally in some embodiments of this disclosure, the gate is between the semiconductor active layer and the base substrate, and the modulation electrode is between the gate and the base substrate.

Optionally in some embodiments of this disclosure, the thin film transistor further includes a first insulation layer and a second insulation layer; and the first insulation layer is between the semiconductor active layer and the gate, and the second insulation layer is between the gate and the modulation electrode.

Optionally in some embodiments of this disclosure, the thin film transistor further includes a conductive layer insulated from the modulation electrode, the semiconductor active layer, the gate, the source, and the drain; wherein an orthographic projection of the conductive layer on the base substrate overlaps with an orthographic projection of the gate on the base substrate, and the orthographic projection of the conductive layer on the base substrate does not overlap with the orthographic projection of the modulation electrode on the base substrate.

Optionally in some embodiments of this disclosure, the conductive layer and the modulation layer are at a same layer, and made of a same material.

Optionally in some embodiments of this disclosure, the semiconductor active layer includes any one of an amorphous silicon active layer, a poly-silicon active layer, and a metal oxide semiconductor active layer.

Correspondingly an embodiment of this disclosure further provides a method for fabricating a thin film transistor. The method includes: forming a semiconductor active layer, a source, a drain, a gate, and a modulation electrode respectively on one side of a base substrate, wherein the source is electrically connected with one end of the semiconductor active layer, the drain is electrically connected with the other end of the semiconductor active layer, and the gate is insulated from the semiconductor active layer, the source, and the drain; and the modulation electrode is proximate to the drain, and an orthographic projection of the modulation electrode on the base substrate has an overlap area with an orthographic projection of the semiconductor active layer on the base substrate.

Optionally in some embodiments of this disclosure, the semiconductor active layer is fabricated in a low temperature poly-silicon process.

Correspondingly an embodiment of this disclosure further provides a method for controlling a thin film transistor. The method includes: applying a first level signal to the gate of the thin film transistor to control the thin film transistor to be turned off; and applying a second level signal to the modulation electrode of the thin film transistor, wherein the first level signal is opposite in level to the second level signal.

Correspondingly an embodiment of this disclosure further provides a display panel including the thin film transistors above.

Optionally in some embodiments of this disclosure, the display panel includes a light-emitting diode display panel.

Optionally in some embodiments of this disclosure, the light-emitting diode display panel includes a plurality of pixel elements, at least one of which includes a light-emitting diode, and a pixel compensation circuit electrically connected with the light-emitting diode; and the pixel compensation circuit includes at least one of the thin film transistors.

Optionally in some embodiments of this disclosure, the display panel includes a liquid crystal display panel.

Optionally in some embodiments of this disclosure, the liquid crystal display panel includes a plurality of pixel elements, at least one of which includes a pixel electrode, and at least one of the thin film transistors, which is electrically connected with the pixel electrode.

Optionally in some embodiments of this disclosure, the display panel further includes an initialization signal line electrically connected with the modulation electrode of the at least one of the thin film transistors.

Correspondingly an embodiment of this disclosure further provides a display device including the display panel above.

BRIEF DESCRIPTION OF THE DRAWINGS

The drawings here are incorporated into the specification, constitute a part of the specification, illustrate the embodiments of this disclosure, and serve together with the description to set forth the principle of this disclosure. Apparently the drawings to be described below illustrate only a part of the embodiments of this disclosure, and those ordinarily skilled in the art can further drive other drawings from these drawings without any inventive effort.

DETAILED DESCRIPTION

Figure 1:
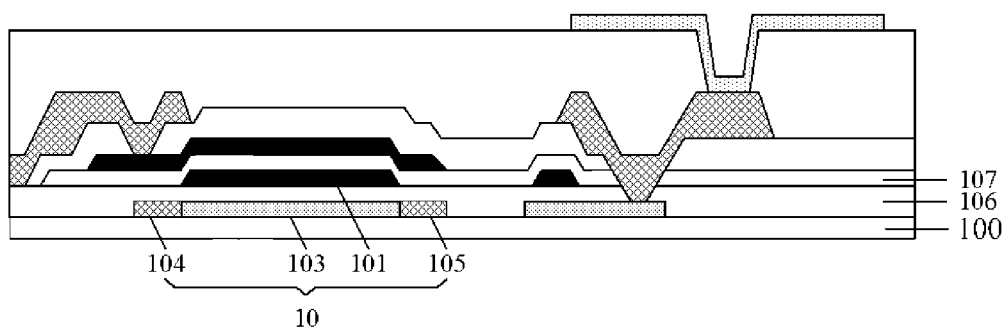
FIG. 1 is a schematic structural diagram of a thin film transistor in the related art.

Exemplary embodiments of this disclosure will be described below in further details with reference to the drawings. However the exemplary embodiments can be implemented in a number of forms, and shall not be construed as being limited to the examples here; and on the contrary, these embodiments are provided to make this disclosure more comprehensive and complete, and to convey the idea of the exemplary embodiments completely to those skilled in the art. The features, structures, or characteristics described here can be combined as appropriate in one or more embodiments.

Moreover the drawings are only schematically illustrative of this disclosure, but not necessarily drawn to scale. Like or similar reference numerals throughout the drawings will refer to like or similar components, so a repeated description thereof will be omitted here. Some blocks as illustrated in the drawings refer to functional entities, but may not necessarily correspond to physically or logically separate entities. These functional entities can be embodied in a software form, or can be embodied in one or more hardware modules or integrated circuits, or can be embodied in different networks and/or processor devices and/or micro-controller devices.

FIG. 1 is a schematic structural diagram of a thin film transistor in the related art. As illustrated in FIG. 1, the thin film transistor 10 can include a base substrate 100, a semiconductor active layer 103 located on the base substrate 100, an source 104 and a drain 105 located on two ends of the semiconductor active layer 103, and electrically connected therewith, a first insulation layer 106 located on the semiconductor active layer 103, the source 104, and the drain 106, a gate 101 located on the first insulation layer 106, and a second insulation layer 107 located on the gate 101.

In the structure of the thin film transistor as illustrated in FIG. 1, when a gate ON signal is applied to the gate 101, the source 104 is connected with the drain 105 so that a signal on the source 104 can be transmitted to the drain 105. When a gate OFF signal is applied to the gate 101, the source 104 is disconnected from the drain 105. However an electric field with a high electric field intensity is generated on the gate 101 at this time, and frequently an energy band may be excessively bent as illustrated in FIG. 1 due to the high electric field intensity, thus resulting in a tunneling effect in the thin film transistor. At this time, electron move from a valence band Ev to a conduction band Ec due to the tunneling effect, and thus become carriers, thus resulting in leakage current. Researches on the mechanism of the thin film transistor showed that the leakage current in the thin film transistor occurs due to the tunneling effect arising from the energy band being bent at the high electric field intensity, so it is necessary to improve the traditional structure of the thin film transistor accordingly to thereby lower the occurrence probability of the tunneling effect.

Figure 3:
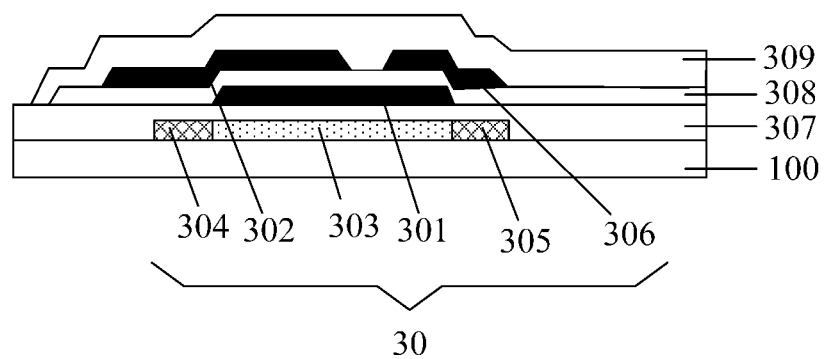
FIG. 3 is a first schematic structural diagram of a thin film transistor according to an exemplary embodiment of this disclosure.
Figure 4:
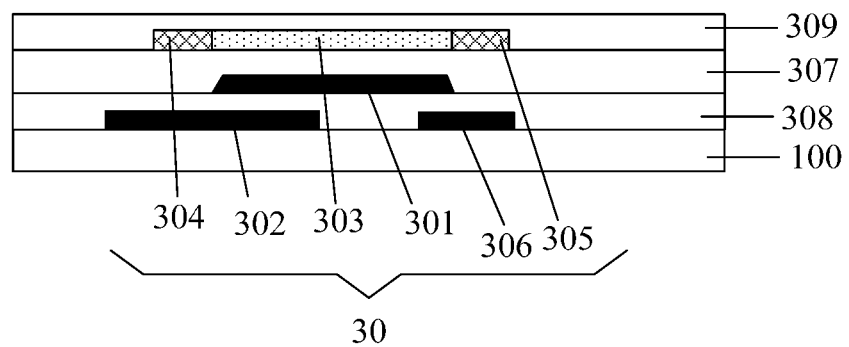
FIG. 4 is a second schematic structural diagram of the thin film transistor according to the exemplary embodiment of this disclosure.

In view of this, as illustrated in FIG. 3 and FIG. 4, a thin film transistor 30 according to an exemplary embodiment of this disclosure can include: a base substrate 100, a semiconductor active layer 303 located on one side of the base substrate 100, a source 304 electrically connected with one end of the semiconductor active layer 303, a drain 305 electrically connected with the other end of the semiconductor active layer 303, a gate 301 arranged insulated from the semiconductor active layer 303, the source 304 and the drain 305, and a modulation electrode 306 arranged insulated from the semiconductor active layer 303, the gate 301, the source 304 and the drain 305, where the source 304 and the drain 305 are located respectively on two ends of the semiconductor active layer 303. The modulation electrode 306 is arranged proximate to the drain 305, and there is an overlapping area between an orthographic projection of the modulation electrode 306 on the base substrate 100 and an orthographic projection of the semiconductor active layer 303 on the base substrate 100. Specifically when a signal is applied to the gate 301, a control electric field can be generated to control the gate, and when a signal is applied to the modulation electrode 306, an opposite electric field can be generated opposite to the electric field direction of the control electric field.

Since the opposite electric field shall be applied near the drain 305 of the thin film transistor 30, operating levels of the gate 301 and the modulation electrode 306 when the thin film transistor is turned off can be set to opposite levels, and for example, the operating level of the gate 301 can be a positive level, and the operating level of the modulation level 306 can be a negative level; or the operating level of the gate 301 can be a negative level, and the operating level of the modulation level 306 can be a positive level, specifically dependent upon a doped type of the thin film transistor.

Figure 2:
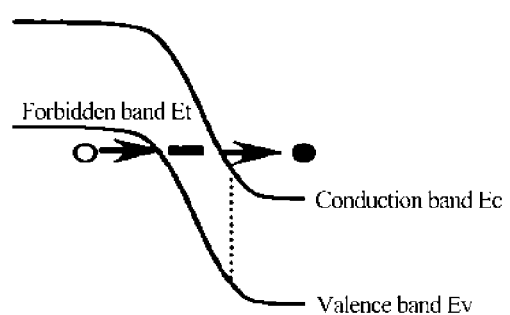
FIG. 2 is a schematic structural diagram of leakage current due to the tunneling effect of carriers in the thin film transistor in the related art.
Figure 5:
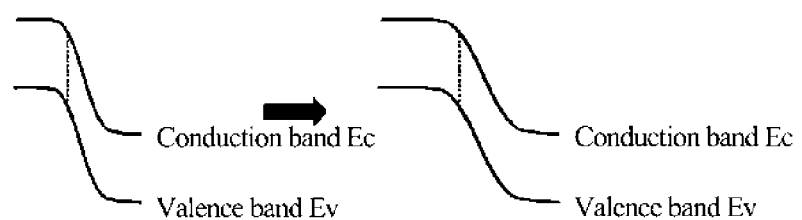
FIG. 5 is a schematic diagram of the bent state of the energy band of the thin film transistor according to the exemplary embodiment of this disclosure.

In the thin film transistor 30 according to the exemplary embodiment of this disclosure, the modulation electrode 306 is arranged proximate to the drain 305, to adjust and control a distribution of the electric field using the modulation electrode 306. Since there is generally leakage current in the traditional structure of the thin film transistor, and the researches on the mechanism of the thin film transistor showed that the leakage current occurs due to the tunneling effect arising from the energy band being excessively bent at the high electric field intensity as illustrated in FIG. 2, thus the modulation electrode 306 is arranged proximate to the drain 305 in the exemplary embodiment of this disclosure, and when the thin film transistor 30 is turned off, the opposite level signal to the signal on the gate 301 is applied to the modulation electrode 306 so that an opposite electric field is generated near the drain 305 for the effect of alleviating the energy band from being bent near the drain as illustrated in FIG. 5, so as to address the problem of leakage current arising from the tunneling effect, and to guarantee the stability of the circuit of the thin film transistor.

In a specific implementation, when the thin film transistor is to be turned off, the gate 301 can be set, for example, at a high-level signal, to apply a downward electric field to a channel area of the semiconductor active layer 303, and the modulation electrode 306 can be set, for example, at a low-level signal, to generate an opposite electric field which can cancel off a part of the electric field generated by the gate 301, to thereby alleviate an energy band from being bent, as illustrated in FIG. 4, so as to make it more difficult for charges to tunnel, for the effect of lower leakage current.

In some implementation, in a specific implementation, in the embodiment of this disclosure, as illustrated in FIG. 3, the gate 301 can be located on the side of the semiconductor active layer 303 away from the base substrate 100, and the modulation electrode 306 can be located on the side of the gate 301 away from the base substrate 100, so that the top gate thin film transistor can be formed. Furthermore as illustrated in FIG. 3, the thin film transistor 30 can further include a first insulation layer 307 and a second insulation layer 308, where the first insulation layer 307 can be located between the semiconductor active layer 303 and the gate 301, so that the semiconductor active layer 303 can be insulated from the gate 301, and the second insulation layer 308 can be located between the gate 301 and the modulation electrode 306 so that the modulation electrode 306 can be insulated from the gate 301.

In a specific implementation, in the embodiment of this disclosure, as illustrated in FIG. 3, the thin film transistor 30 can further include a conductive layer 302 arranged insulated respectively from the modulation electrode 306, the semiconductor active layer 303, the gate 301, the source 304, and the drain 305, where an orthographic projection of the conductive layer 302 on the base substrate 100 has an overlap area with an orthographic projection of the gate 301 on the base substrate 100, and the orthographic projection of the conductive layer 302 on the base substrate 100 does not overlap with the orthographic projection of the modulation electrode 306 on the base substrate 100.

In a specific implementation, in the embodiment of this disclosure, as illustrated in FIG. 3, the thin film transistor 30 can further include an isolation layer 309 located on the side of the conductive layer 302 away from the base substrate 100 so that the isolation layer 309 can protect the conductive layer 302 and the modulation electrode 306.

In some other possible implementation, in a specific implementation, in the embodiment of this disclosure, as illustrated in FIG. 4, alternatively the gate 301 can be located between the semiconductor active layer 303 and the base substrate 100, and the modulation electrode 306 can be located between the gate 301 and the base substrate 100, so that the bottom gate thin film transistor can be formed. Furthermore as illustrated in FIG. 4, the thin film transistor 300 can further include a first insulation layer 307 and a second insulation layer 308, where the first insulation layer 307 can be located between the semiconductor active layer 303 and the gate 301, so that the semiconductor active layer 303 can be insulated from the gate 301, and the second insulation layer 308 can be located between the gate 301 and the modulation electrode 306, so that the modulation electrode 306 can be insulated from the gate 301.

In a specific implementation, in the embodiment of this disclosure, as illustrated in FIG. 4, the thin film transistor 30 can further include an isolation layer 309 located on the side of the semiconductor active layer 303 away from the base substrate 100 so that the isolation layer 309 can protect the semiconductor active layer 303. Furthermore as illustrated in FIG. 4, the thin film transistor 30 can further include a conductive layer 302 arranged insulated respectively from the modulation electrode 306, the semiconductor active layer 303, the gate 301, the source 304, and the drain 305, where an orthographic projection of the electrical conductive layer 302 on the base substrate 100 overlaps with an orthographic projection of the gate 301 on the base substrate 100, and the orthographic projection of the conductive layer 302 on the base substrate 100 does not overlap with the orthographic projection of the modulation electrode 306 on the base substrate 100.

In a specific implementation, in the embodiment of this disclosure, as illustrated in FIG. 3 and FIG. 4, the conductive layer 302 and the modulation layer 306 can be arranged at the same layer, and made of the same material, so that the patterns of the conductive layer 302 and the modulation layer 306 can be formed in the same patterning process without any additional process of forming the modulation electrode 306, to thereby simplify the fabrication process, save the production cost, and improve the production efficiency. In addition to this, the conductive layer 302 can be spaced from the modulation electrode 306 by a preset distance to thereby remain electrically insulated from the modulation electrode; and the conductive layer 302 is arranged proximate to the source 304, and the modulation electrode 306 is arranged proximate to the drain 305, but both of them correspond to the semiconductor active layer 303.

In a specific implementation, in the embodiment of this disclosure, the semiconductor active layer 303 can include any one of an amorphous silicon active layer, a poly-silicon active layer, and a metal oxide semiconductor active layer, where the poly-silicon active layer can be a poly-silicon pattern layer formed in a low temperature poly-silicon process.

In a specific implementation, the thin film transistor 30 can be applicable to a Liquid Crystal Display (LCD). With the development of the self-light-emitting display technologies, a Quantum Dot Light-Emitting Diode (QLED) display and an Organic Light-Emitting Diode (OLED) display are gradually taking the place of the LCD due to their low power consumption, low cost, wide angle of view, high response speed, etc. Since the OLED and the QLED are current-driven, a pixel compensation circuit is generally arranged to generate operating current for driving the OLED and the QLED to emit light. The pixel compensation circuit generally includes a thin film transistor and a storage capacitor, so that the thin film transistor in the pixel compensation circuit controls a pixel to be turned on and off so that the OLED display and the QLED display perform a display function. In a specific implementation, the thin film transistor 30 can alternatively be applicable to the OLED display and the QLED display. Furthermore the conductive layer 302 and the gate 301 can constitute the storage capacitor in the pixel compensation circuit.

Furthermore the thin film transistor can be controlled by dual gates to thereby improve the performance thereof. In a specific implementation, the conductive layer 302 can be the second gate of the thin film transistor instead of an electrode in the storage capacitor, thus both the conductive layer 302 and the gate 301 can be the gates for controlling the active layer to thereby improve the gate control effect through the conductive layer 302 in addition to the gate 301, and the modulation electrode 306 can be arranged to alleviate the bent extent of the energy band proximate to the drain 305.

It shall be noted that the relative position between various components in the thin film transistor will not be limited to what illustrated in FIG. 3 and FIG. 4 as along as an adjusting electrode, e.g., the modulation electrode 306, is arranged, although the embodiment of this disclosure will not be limited thereto.

Based upon the same inventive idea, an embodiment of this disclosure further provides a method for fabricating a thin film transistor, where the method can include the following steps.

Forming a semiconductor active layer, a source, a drain, a gate, and a modulation electrode respectively on one side of a base substrate, where the source is electrically connected with one end of the semiconductor active layer, the drain is electrically connected with the other end of the semiconductor active layer, and the gate is arranged insulated from the semiconductor active layer, the source, and the drain; and the modulation electrode is arranged proximate to the drain, and an orthographic projection of the modulation electrode on the base substrate has an overlap area with an orthographic projection of the semiconductor active layer on the base substrate.

Figure 6:
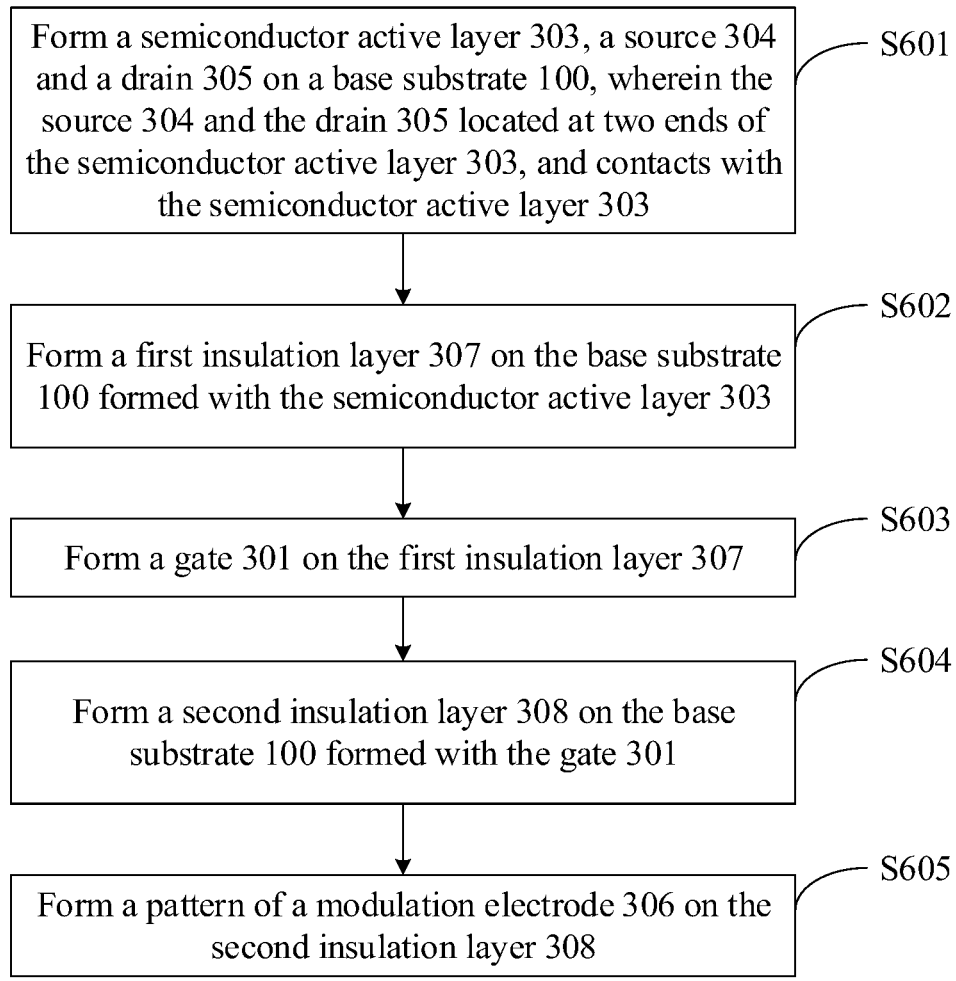
FIG. 6 is a flow chart of a method for fabricating a thin film transistor according to an exemplary embodiment of this disclosure.

The method for fabricating a thin film transistor according to the embodiment of this disclosure will be described below taking the structure of the thin film transistor as illustrated in FIG. 3 as an example. As illustrated in FIG. 6, the method for fabricating a thin film transistor according to the embodiment of this disclosure can include the following steps.

The step S601 is to form a semiconductor active layer 303, a source 304 and a drain 305 on a base substrate 100 in a patterning process, wherein the source 304 and the drain 305 located at two ends of the semiconductor active layer 303, and contacts with the semiconductor active layer 303. Specifically the semiconductor active layer 303 is formed in a low temperature poly-silicon process.

The step S602 is to form a first insulation layer 307 on the base substrate 100 formed with the semiconductor active layer 303 in a patterning process.

The step S603 is to form a gate 301 on the first insulation layer 307 in a patterning process, where an orthographic projection of the gate 301 on the base substrate 100 has an overlap area with an orthographic projection of a channel area of the semiconductor active layer 303 on the base substrate 100. Furthermore the orthographic projection of the gate 301 on the base substrate 100 lies within the orthographic projection of the channel area of the semiconductor active layer 303 on the base substrate 100.

The step S604 is to form a second insulation layer 308 on the base substrate 100 formed with the gate 301 in a patterning process.

The step S605 is to form a pattern of a modulation electrode 306 on the second insulation layer 308 in a patterning process.

The structure of the thin film transistor including the modulation electrode 306 can be formed in the steps above, where the modulation electrode 306 can generate an opposite electric field near the drain 305 to thereby control an electric field distribution, so as to alleviate an bent extent of energy band, and to address leakage current arising from the tunneling effect.

Furthermore a pattern of the conductive layer 302 is further formed in the step S605.

It shall be noted that in the fabricating method above according to the embodiment of this disclosure, the patterning process can include only a photo-lithography process, or can include a photo-lithography process and an etching step, and also printing, ink-jetting, or other processes for forming a predetermined pattern; and the photo-lithography process refers to a process for forming a pattern using photo-resist, a mask, an exposure machine, etc., in film formation, exposure, development, and other processes. In a specific implementation, a corresponding patterning process can be selected based on a structure to be formed in the embodiment of this disclosure.

Figure 7:
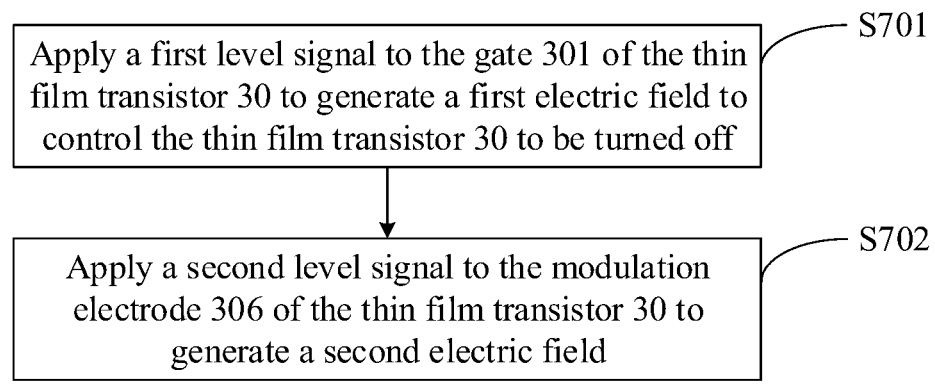
FIG. 7 is a flow chart of a method for controlling a thin film transistor according to an exemplary embodiment of this disclosure.

Based upon the same inventive idea, an embodiment of this disclosure further provides a method for controlling a thin film transistor, where the method can be applicable to the thin film transistor 30 to thereby alleviate leakage current in the thin film transistor 30. As illustrated in FIG. 7, the controlling method can include the following steps.

The step S701 is to apply a first level signal, e.g., a positive level voltage signal, to the gate 301 of the thin film transistor, to generate a first electric field to control the thin film transistor 30 to be turned off.

The step S702 is to apply a second level signal, e.g., a negative level voltage signal, to the modulation electrode 306 of the thin film transistor 30, to generate a second electric field to cancel off an electric field intensity of the first electric field proximate to the drain 305 of the thin film transistor 30.

Where the first level signal is opposite in level to the second level signal, that is, operating levels of the first level signal and the second level signal are opposite levels in polarity, so that the generated first electric field and second electric field can be electric fields opposite in direction. The polarities of the first level signal and the second level signal can be determined dependent upon a doped type of the thin film transistor 30.

In the method for controlling the thin film transistor 30 according to the exemplary embodiment of this disclosure, the first level signal is applied to the gate 301 to generate the first electric field, and the second level signal is applied to the modulation electrode 306 to generate the second electric field opposite to the first electric field, to achieve the effect of alleviating an energy band from being bent as illustrated in FIG. 5, to thereby alleviate leakage current arising from the tunneling effect, and guarantee the stability of the thin film transistor.

Based upon the same inventive idea, an embodiment of this disclosure further provides a display panel including the thin film transistor according to the embodiment of this disclosure. The thin film transistor can be structured as illustrated in FIG. 3 and FIG. 4, and a repeated description thereof will be omitted here. The display panel will be described below taking FIG. 3 as an example.

In a specific implementation, in the embodiment of this disclosure, the display panel can include a light-emitting diode display panel. Furthermore the light-emitting diode display panel includes a plurality of pixel elements, the pixel element includes a light-emitting diode, and a pixel compensation circuit electrically connected with the light-emitting diode.

Figure 8:
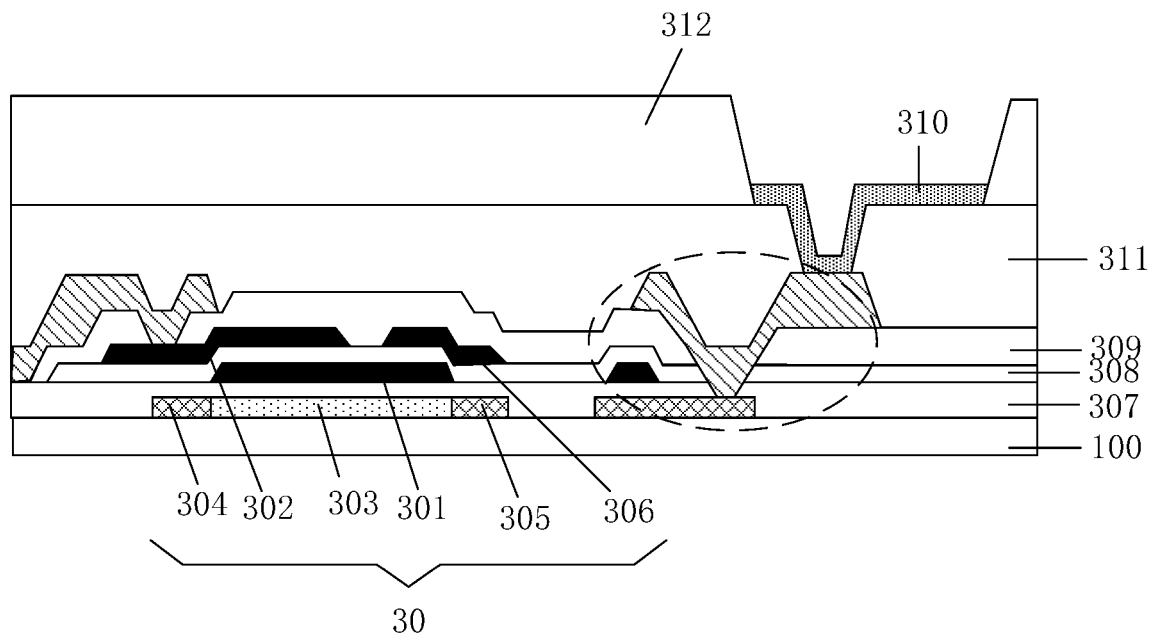
FIG. 8 is a first schematic structural diagram of a display panel according to an exemplary embodiment of this disclosure.
Figure 9:
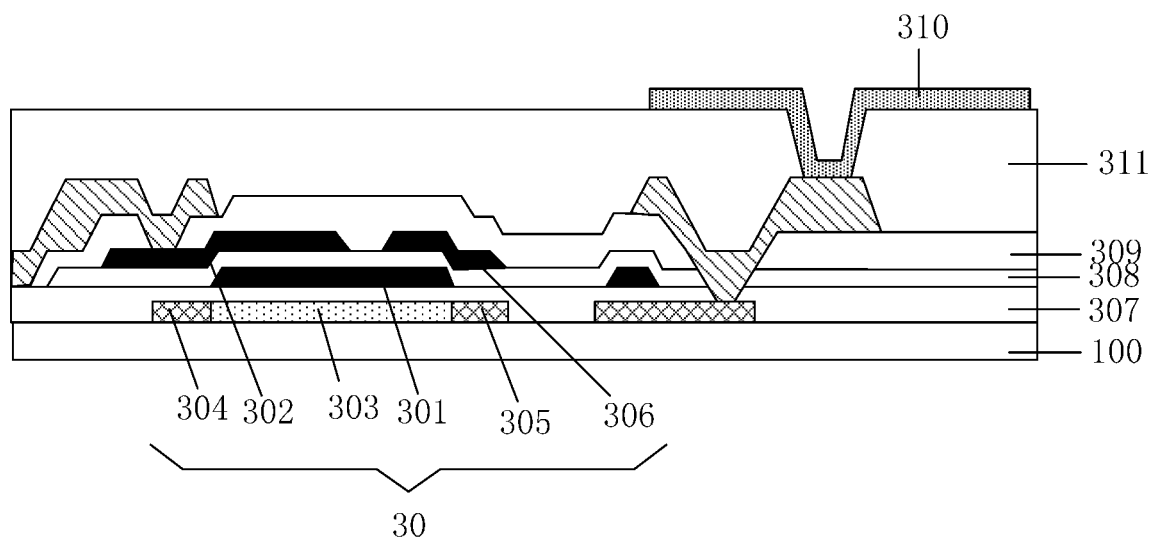
FIG. 9 is a second schematic structural diagram of a display panel according to an exemplary embodiment of this disclosure.

Specifically the light-emitting diode can include an OLED and a QLED. The pixel compensation circuit can include at least one thin film transistor. As illustrated in FIG. 3 and FIG. 8, the display panel can include the thin film transistor 30 above, a pixel electrode 310, e.g., an anode, electrically connected with the drain 305 of the thin film transistor 30, a planarization layer 311 located between the pixel electrode 310 and the thin film transistor 30, a pixel definition layer 312 located on the side of the pixel electrode 310 away from the thin film transistor 30, an organic material light-emitting layer located in the pixel definition layer 312, and a common electrode, e.g., a cathode, located on the side of the organic material light-emitting layer away from the pixel electrode 310.

In a specific implementation, the display panel can further include an initialization signal line electrically connected with the modulation electrode of the thin film transistor, so that a signal is transmitted to the modulation electrode through the initialization signal line. A first level signal of the gate 301 of the thin film transistor 30 can be generated by the pixel compensation circuit to thereby generate a first electric field for controlling the thin film transistor 30 to be turned off; a capacitor can be formed between the conductive layer 302 and the gate 301 to maintain the voltage on the gate 301, and to maintain a gate control effect; and a second level signal of the modulation electrode 306 can be generated on an initialization signal line Vint to thereby generate an electric field opposite to the first electric field, so as to achieve the effect of alleviating an energy band from being bent. Furthermore the initialization signal line Vint is generally a signal line originally on the display panel, so the opposite electric field can be generated in this embodiment without any additional line.

It shall be noted that the thin film transistor 30 in the embodiment of this disclosure can be driver transistor in the pixel compensation circuit, but since other switch transistor may be further arranged in the pixel compensation circuit, the pixel electrode 310, e.g., the anode, may not necessary to directly contact with the drain 305 of the driver transistor, so it may suffice only if the pixel electrode 310 is electrically connected with the drain of the driver transistor while the light-emitting diode is emitting light. For example, the pixel electrodes 310 in FIG. 8 can be connected with other switch transistors (denoted in a dotted circle), and it may suffice only if the other switch transistors transmit an electric signal of the driver transistor directly to the pixel electrode 310 while the light-emitting diode is emitting light. Moreover since the source and the drain are symmetric to each other, the source and the drain may not be strictly distinguished from each other in this embodiment, but the electrode connected with the pixel electrode 310 in operation is referred to as drain.

In a specific implementation, in the embodiment of this disclosure, the display panel can alternatively include a liquid crystal display panel. Furthermore the liquid crystal display panel can include a plurality of pixel elements, each of which includes a pixel electrode 310, and at least one thin film transistor 30 electrically connected with the pixel electrode 310. The thin film transistor 30 is configured to transmit a signal received at the source thereof to the pixel electrode 310 upon being turned on. The thin film transistor 30 is configured to lower leakage current upon being turned off, to thereby alleviate a signal on the pixel electrode 310 from being attenuated. Furthermore in a specific implementation, the display panel can further include an initialization signal line electrically connected with the modulation electrode of the thin film transistor so that a signal is transmitted to the modulation electrode through the initialization signal line.

Based upon the same inventive idea, an embodiment of this disclosure further provides a display device including the display panel above. For example, the display device can include a mobile phone, a tablet computer, a TV set, a notebook computer, a digital photo frame, a navigator, or any other product or component with a display function. All the other indispensable components to the display device shall readily occur to those ordinarily skilled in the art, so a repeated description thereof will be omitted here, and the embodiment of this disclosure will not be limited thereto. Reference can be made to the embodiment of the display panel above for an implementation of the display device, and a repeated description thereof will be omitted here.

It shall be noted that although several modules or units in the device for performing the actions have been discussed in the detailed description above, the device may not necessarily be divided into those modules or units. In fact, features or functions of two or more of the modules or units above can be embodied in one module or unit. On the contrary, features and functions of one of the modules or units above can be further divided into a plurality of modules or units.

Although the respective steps in the method according to the embodiment of this disclosure have been described with reference to the drawings in a specific order, this shall not require or suggest that these steps be performed in the specific order, or all of the steps be performed for a desirable result. Additionally or alternatively some of the steps may be omitted, or more than one of the steps may be combined into one step, and/or one of the steps may be decomposed into more than one step to be executed.

Other embodiments of this disclosure shall readily occur to those skilled in the art upon considering the specification, and practicing this disclosure as described here. This disclosure is intended to encompass any variations, uses, or adaptations of this disclosure, and all these variations, uses, or adaptations shall comply with the general principle of this disclosure, and encompass well-known knowledge or common technical means in the prior at although they may not have been described in this disclosure. The description and the embodiments are only illustrative of this disclosure, but the true scope and spirit of this disclosure shall be as defined in the appended claims.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:
1. A thin film transistor, comprising:
a base substrate;
a semiconductor active layer on one side of the base substrate;
a source electrically connected with one end of the semiconductor active layer;
a drain electrically connected with the other end of the semiconductor active layer;
a first gate insulated from the semiconductor active layer, the source, and the drain;
a modulation electrode insulated from the semiconductor active layer, the first gate, the source, and the drain; and
a second gate, provided on a layer same as the modulation electrode, spaced from the modulation electrode, and proximate to the source;
wherein the modulation electrode is proximate to the drain, and an orthographic projection of the modulation electrode on the base substrate has an overlap area with an orthographic projection of the semiconductor active layer on the base substrate;
an orthographic projection of the second gate on the base substrate overlaps with an orthographic projection of the first gate on the base substrate, and the orthographic projection of the second gate on the base substrate does not overlap with the orthographic projection of the modulation electrode on the base substrate;

when the thin film transistor is turned off, a level applied to the first gate is opposite to a level applied to the modulation electrode;

the first gate is on a side of the semiconductor active layer away from the base substrate, and the modulation electrode is located on a side of the first gate away from the base substrate.

2. The thin film transistor according to claim 1, further comprising: a first insulation layer and a second insulation layer; wherein the first insulation layer is between the semiconductor active layer and the first gate, and the second insulation layer is between the first gate and the modulation electrode.

3. The thin film transistor according to claim 1, wherein the semiconductor active layer comprises any one of an amorphous silicon active layer, a poly-silicon active layer, or a metal oxide semiconductor active layer.

4. A method for controlling the thin film transistor according to claim 1, comprising:

applying a first level signal to the first gate of the thin film transistor to control the thin film transistor to be turned off; and applying a second level signal to the modulation electrode of the thin film transistor, wherein the first level signal is opposite in level to the second level signal.

5. A display panel, comprising a plurality of thin film transistors according to claim 1;

wherein the display panel further comprises an initialization signal line electrically connected with the modulation electrode of at least one of the thin film transistors.

6. The display panel according to claim 5, wherein the display panel comprises a light-emitting diode display panel.

7. The display panel according to claim 6, wherein the light-emitting diode display panel comprises a plurality of pixel elements, at least one of which comprises a light-emitting diode, and a pixel compensation circuit electrically connected with the light-emitting diode; and the pixel compensation circuit comprises at least one of the thin film transistors.

8. The display panel according to claim 5, wherein the display panel comprises a liquid crystal display panel.

9. The display panel according to claim 8, wherein the liquid crystal display panel comprises a plurality of pixel elements, at least one of which comprises a pixel electrode, and at least one of the thin film transistors, which is electrically connected with the pixel electrode.

10. A display device, comprising the display panel according to claim 5.

11. A method for fabricating a thin film transistor, comprising:

forming a semiconductor active layer, a source, a drain, a first gate, and a modulation electrode, and a second gate respectively on one side of a base substrate, wherein the source is electrically connected with one end of the semiconductor active layer, the drain is electrically connected with the other end of the semiconductor active layer, and the first gate is insulated from the semiconductor active layer, the source, and the drain; the second gate is provided on a layer same as the modulation electrode, is spaced from the modulation electrode, and is proximate to the source; the modulation electrode is proximate to the drain, and an orthographic projection of the modulation electrode on the base substrate has an overlap area with an orthographic projection of the semiconductor active layer on the base substrate; an orthographic projection of the second gate on the base substrate overlaps with an orthographic projection of the first gate on the base substrate, and the orthographic projection of the second gate on the base substrate does not overlap with the orthographic projection of the modulation electrode on the base substrate; and when the thin film transistor is turned off, a level applied to the first gate is opposite to a level applied to the modulation electrode.

12. The method according to claim 11, wherein the semiconductor active layer is fabricated in a low temperature poly-silicon process.

* * * * *